(12) United States Patent
Watanabe

(10) Patent No.: US 9,793,189 B2
(45) Date of Patent: Oct. 17, 2017

(54) PRINTED WIRING BOARD ASSEMBLY, ELECTRICAL DEVICE, AND METHOD FOR ASSEMBLING PRINTED WIRING BOARD ASSEMBLY

(71) Applicant: FUJITSU LIMITED, Kawasaki-shi, Kanagawa (JP)

(72) Inventor: Manabu Watanabe, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/238,062

(22) Filed: Aug. 16, 2016

(65) Prior Publication Data

US 2017/0053850 A1 Feb. 23, 2017

(30) Foreign Application Priority Data

Aug. 20, 2015 (JP) ................................. 2015-162875

(51) Int. Cl.
*H05K 7/20* (2006.01)
*H01L 23/367* (2006.01)
(Continued)

(52) U.S. Cl.
CPC ...... *H01L 23/3675* (2013.01); *H01L 21/4853* (2013.01); *H01L 23/3128* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 5,907,475 A * 5/1999 Babinski .................. H05K 1/14
361/719
6,930,386 B1 * 8/2005 Cesulka .............. H01L 23/3677
257/718
(Continued)

FOREIGN PATENT DOCUMENTS

JP 2000-286303 10/2000

*Primary Examiner* — Anthony Haughton
*Assistant Examiner* — Razmeen Gafur
(74) *Attorney, Agent, or Firm* — Staas & Halsey LLP

(57) ABSTRACT

A printed wiring board assembly includes a first board including a first surface; a second board including a second surface and facing the first surface; a plurality of first electrodes formed on a bottom surface of a recess formed in one of the first and the second surfaces; a plurality of second electrodes formed on the one of the first surface and the second surface and positioned outside the recess; a plurality of first solders each coupled to a respective one of the plurality of first electrodes; and a plurality of second solders each coupled to a respective one of the plurality of second electrodes, wherein the plurality of first electrodes are formed at a larger pitch than a pitch at which the plurality of second electrodes are formed, and a size of each the plurality of first solders is larger than a size of the plurality of second solders.

7 Claims, 27 Drawing Sheets

(51) Int. Cl.
*H01L 23/31* (2006.01)
*H01L 23/498* (2006.01)
*H05K 3/36* (2006.01)
*H01L 21/48* (2006.01)
*H05K 1/14* (2006.01)
*H05K 1/18* (2006.01)
*H05K 3/34* (2006.01)

(52) U.S. Cl.
CPC ....... *H01L 23/49838* (2013.01); *H05K 1/141* (2013.01); *H05K 3/368* (2013.01); *H01L 2924/15159* (2013.01); *H01L 2924/15311* (2013.01); *H05K 1/181* (2013.01); *H05K 3/3436* (2013.01); *H05K 2201/066* (2013.01); *H05K 2201/09036* (2013.01); *H05K 2203/041* (2013.01); *H05K 2203/0415* (2013.01)

(56) References Cited

U.S. PATENT DOCUMENTS

| | | | | |
|---|---|---|---|---|
| 2002/0008963 A1* | 1/2002 | DiBene, II | ............... | G06F 1/18 361/720 |
| 2002/0030972 A1* | 3/2002 | Ali | ............... | H01L 23/4006 361/704 |
| 2005/0024834 A1* | 2/2005 | Newby | ............... | F21K 9/00 361/719 |
| 2006/0133043 A1* | 6/2006 | Boudreaux | ............ | H05K 1/144 361/704 |
| 2006/0245166 A1* | 11/2006 | Bonomo | ............ | H05K 7/2049 361/715 |
| 2007/0139897 A1* | 6/2007 | RaghuRam | ......... | H01L 23/3672 361/720 |
| 2008/0055863 A1* | 3/2008 | Cho | ....................... | H01L 24/97 361/711 |
| 2008/0218979 A1* | 9/2008 | Park | ..................... | H05K 1/0206 361/712 |
| 2009/0086431 A1* | 4/2009 | Sakamoto | .......... | H05K 7/20009 361/695 |
| 2009/0316366 A1* | 12/2009 | Mullen | ............... | H01L 23/3677 361/717 |
| 2010/0315787 A1* | 12/2010 | Li | ....................... | H01L 23/3677 361/709 |
| 2011/0110047 A1* | 5/2011 | Pauley | ................. | H05K 1/0203 361/715 |
| 2012/0188708 A1* | 7/2012 | Ankireddi | ............ | H01L 23/367 361/679.54 |
| 2013/0063895 A1* | 3/2013 | Ritter | ..................... | H01L 23/36 361/692 |
| 2013/0135823 A1* | 5/2013 | Kim | ..................... | H01L 23/043 361/697 |
| 2013/0343000 A1* | 12/2013 | Shi | ...................... | H01L 23/3677 361/717 |
| 2014/0085823 A1* | 3/2014 | Campbell | .......... | H05K 7/20236 361/701 |
| 2014/0362535 A1* | 12/2014 | Meier | ................... | H05K 1/141 361/707 |
| 2015/0098192 A1* | 4/2015 | Washeleski | .......... | H05K 1/0206 361/714 |
| 2015/0201486 A1* | 7/2015 | Voelker | ................ | H05K 7/2039 361/709 |
| 2015/0261265 A1* | 9/2015 | Dean | ........................ | G06F 1/20 361/679.31 |
| 2015/0261266 A1* | 9/2015 | Dean | ........................ | G06F 1/20 361/679.46 |
| 2015/0342084 A1* | 11/2015 | Dorenkamp | .......... | H05K 7/2089 361/720 |

\* cited by examiner

PRINTED WIRING BOARD ASSEMBLY, ELECTRICAL DEVICE, AND METHOD FOR ASSEMBLING PRINTED WIRING BOARD ASSEMBLY

CROSS-REFERENCE TO RELATED APPLICATION

This application is based upon and claims the benefit of priority of the prior Japanese Patent Application No. 2015-162875, filed on Aug. 20, 2015, the entire contents of which are incorporated herein by reference.

FIELD

The embodiments discussed herein are related to a printed wiring board assembly, electrical devices, and a method for assembling a printed wiring board assembly.

BACKGROUND

Information devices have been developed to have higher performance and to have a higher pin count, leading to an increase in size of package substrates and semiconductor chips (semiconductor elements). A semiconductor package includes a package substrate and a semiconductor chip disposed on an upper surface of the package substrate. An example of a structure of a semiconductor package includes a ball grid array (BGA). In a BGA semiconductor package, the BGA balls (solder balls) are arranged in a grid array on a lower surface of the package substrate.

Japanese Laid-open Patent Publication No. 2000-286303 is an example of the related art.

SUMMARY

According to an aspect of the invention, a printed wiring board assembly includes a first board that includes a first surface; a second board that includes a second surface and faces the first surface; a plurality of first electrodes formed on a bottom surface of a recess, the recess being formed in one of the first surface and the second surface; a plurality of second electrodes formed on the one of the first surface and the second surface, the plurality of second electrodes being positioned outside the recess; a plurality of first solders each coupled to a respective one of the plurality of first electrodes; and a plurality of second solders each coupled to a respective one of the plurality of second electrodes, wherein the plurality of first electrodes are formed at a larger pitch than a pitch at which the plurality of second electrodes are formed, and a size of each the plurality of first solders is larger than a size of the plurality of second solders.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An exemplary semiconductor package includes a package substrate having a size of 50 mm×50 mm and BGA balls having a diameter of 0.6 mm, and has a BGA pitch (pitch between the BGA balls) of 1.0 mm. An exemplary large semiconductor package includes a package substrate having a size of 76 mm×76 mm and BGA balls having a diameter of 0.5 mm, and has a BGA pitch of 0.8 mm. In the large semiconductor package, the package substrate has a large size of 76 mm×76 mm, compared to the size of 50 mm×50 mm, and has a fine BGA pitch of 0.8 mm, compared to the BGA pitch of 1.0 mm.

Figure 26:
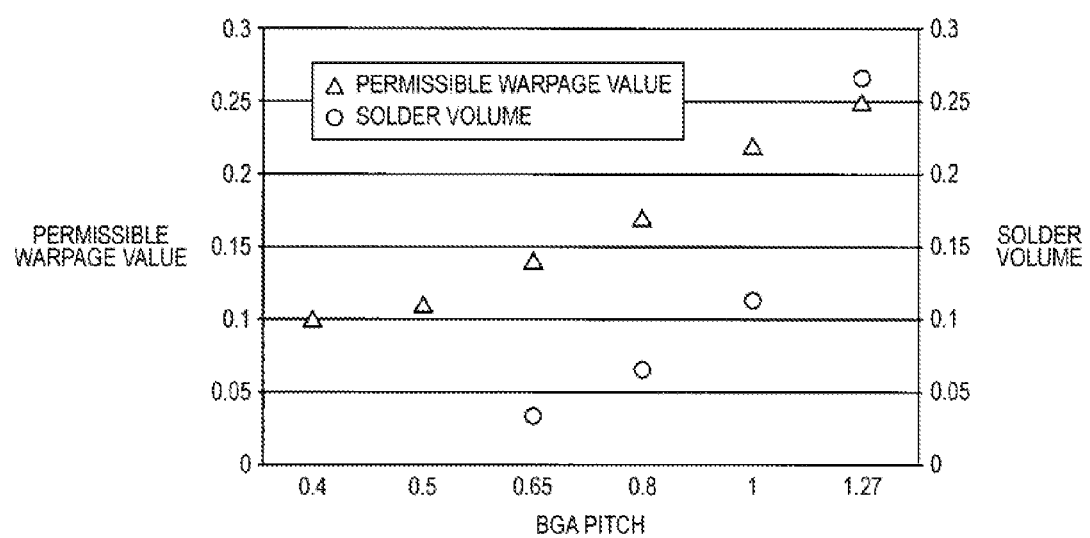
FIG. 26 is a diagram indicating a relationship between a BGA pitch, a permissible warpage value, and a volume of solder of a BGA ball.

In the large semiconductor package, the finer BGA pitch reduces the diameter of lands to which the BGA balls are connected, resulting in a reduction in volume of solder (amount of solder) of each BGA ball. This lowers the permissible warpage value of the package substrate and the permissible warpage value of the printed wiring board which are expected when the large semiconductor package is mounted on the printed wiring board with the BGA balls. FIG. 26 is a diagram indicating relationships between a BGA pitch, a permissible warpage value, and a volume of solder of the BGA ball in accordance with JETTA standards. A horizontal axis in FIG. 26 indicates the BGA pitch (mm). Vertical axes in FIG. 26 indicate the permissible warpage value (mm) and the volume of solder of the BGA ball (mm³). The permissible warpage value indicated in FIG. 26 is a permissible warpage value of the package substrate or the printed wiring board. As indicated in FIG. 26, the permissible warpage value decreases as the volume of solder decreases with a decrease in the BGA pitch.

In a semiconductor package having the BGA pitch of 1.0 mm, the yield of semiconductor packages is 99.991% when the permissible warpage value of the package substrate is 0.10 mm. In a semiconductor package having the BGA pitch of 0.8 mm, the yield of semiconductor packages decreases to 99.257% when the permissible warpage value of the package substrate is 0.10 mm.

This application was made in view of the above-described problems. An object of the application is to provide a technology that enables the permissible warpage value of the board or the substrate to be raised.

Hereinafter, embodiments are described with reference to the drawings. The embodiments are presented for illustrative purposes only and the present disclosure is not limited to the configurations of the embodiments.

First Embodiment

Figure 1:
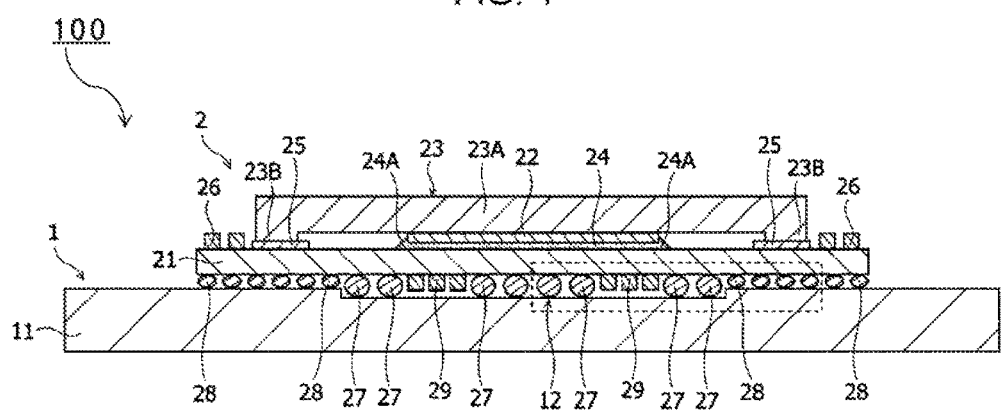
FIG. 1 is a cross-sectional view illustrating a printed wiring board assembly including a printed wiring board and a semiconductor package according to a first embodiment.
Figure 2:
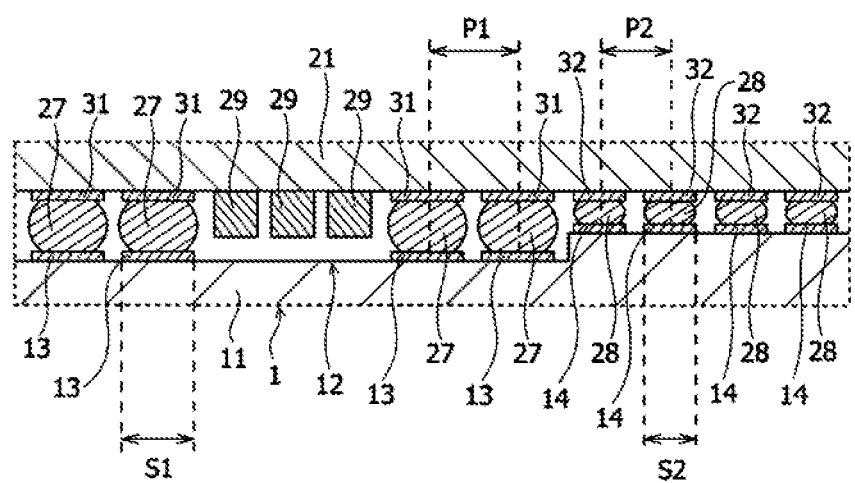
FIG. 2 is a magnified cross-sectional view illustrating the main components of the printed wiring board assembly according to the first embodiment.

A first embodiment is descried with reference to FIG. 1 to FIG. 10. FIG. 1 is a cross-sectional view illustrating a printed wiring board (print board) 1 and a semiconductor package 2 included in a printed wiring board assembly 100 according to a first embodiment. FIG. 2 is a magnified cross-sectional view illustrating the main components of the printed wiring board assembly 100 according to the first embodiment. The printed wiring board 1 includes a substrate 11. The printed wiring board 1 and the substrate 11 are examples of a first board. The substrate 11 is a multilayer substrate including a resin layer and a wiring layer. The semiconductor package 2 is mounted (disposed) on the upper surface (first surface) of the printed wiring board 1. Specifically, the semiconductor package 2 is mounted on the upper surface (first surface) of the substrate 11 of the printed wiring board 1. The printed wiring board 1 and the semiconductor package 2 are electrically connected to each other.

The semiconductor package 2 includes a package substrate 21, a semiconductor chip (semiconductor element) 22, and a heat spreader 23. The package substrate 21 is an example of a second board. The semiconductor chip 22 and the heat spreader 23 are disposed on the upper surface (third surface) of the package substrate 21. The package substrate 21 may be formed of an epoxy resin, polyimide resin, or phenolic resin, for example. The semiconductor chip 22 may be a large scale integration (LSI). A surface of the semiconductor chip 22 having a circuit (hereinafter, referred to as a circuit surface) faces the package substrate 21 (faces downward), and an electrode on the circuit surface of the semiconductor chip 22 and an electrode on the upper surface of the package substrate 21 are connected via the BGA balls. In FIG. 1, the electrode of the semiconductor chip 22, and the electrode and the BGA balls on the upper surface of the package substrate 21 are not illustrated. An underfill resin 24 is formed between the package substrate 21 and the semiconductor chip 22, and a fillet 24A is formed at an outer peripheral portion of the underfill resin 24.

The heat spreader 23 is disposed on the package substrate 21 so as to cover the semiconductor chip 22. The heat spreader 23 may be formed of metal such as copper (Cu) and aluminum (Al). The heat spreader 23 includes a planar member 23A covering the semiconductor chip 22 and a side member 23B connected to an outer peripheral portion of the planar member 23A. A thermal interface material (TIM) may be applied on a surface of the semiconductor chip 22 opposite the circuit surface to fix the semiconductor chip 22 to the planer member 23A of the heat spreader 23 with the TIM. The TIM includes a thermally conductive resin.

An adhesive 25 is applied on a lower surface of the side member 23B of the heat spreader 23. In other words, the adhesive 25 is disposed between the upper surface of the package substrate 21 and the lower surface of the side member 23B of the heat spreader 23. The side member 23B of the heat spreader 23 is fixed to the upper surface of the package substrate 21 with the adhesive 25, and thus the heat spreader 23 is fixed to the package substrate 21. A plurality of chip parts 26 are disposed on an outer peripheral portion of the upper surface of the package substrate 21, which is positioned outward from the side member 23B of the heat spreader 23. The chip parts 26 may be chip capacitors.

The upper surface of the printed wiring board 1 faces a lower surface (second surface), which is opposite the upper surface, of the package substrate 21. A plurality of BGA balls 27 and 28 and a plurality of chip parts 29 are disposed on the lower surface of the package substrate 21. The BGA balls 27 and 28 are spherical solder balls. The BGA ball 27 is an example of a first solder. The BGA ball 28 is an example of a second solder. The chip parts 29 may be chip capacitors. The printed wiring board 1 includes a recess (counter bore) 12 at a predetermined portion of the upper surface. Specifically, the predetermined portion of the upper surface of the printed wiring board 1 is recessed from a portion of the upper surface of the printed wiring board 1 adjacent to the predetermined portion. The predetermined portion of the upper surface of the printed wiring board 1 may be a central portion of the upper surface of the printed wiring board 1. The predetermined portion of the upper surface of the printed wiring board 1 may be a portion of the upper surface of the printed wiring board 1 that faces a central portion of the package substrate 21. The chip parts 29 are positioned in the recess 12, and thus the chip parts 29 and the printed wiring board 1 are unlikely to be in contact with each other.

The printed wiring board 1 includes a plurality of lands 13 and a plurality of lands 14. The lands 13 are disposed on the bottom surface of the recess 12. The lands 14 are disposed on the upper surface of the printed wiring board 1 and are positioned away from the predetermined portion having the recess 12. The lands 14 are formed on a portion of the surface having the recess 12 and are positioned outside the recess 12. In other words, the lands 14 are formed on a portion of the upper surface of the printed wiring board 1 that does not include the recess 12. With this configuration, the lands 13 and the lands 14 are positioned at different levels in the thickness direction of the printed wiring board 1. The lands 13 and 14 may be electrodes formed of copper or aluminum, for example. The lands 13 and 14 are examples of a first electrode and a second electrode, respectively.

In an example illustrated in FIG. 1 and FIG. 2, the chip parts 29 are positioned in the recess 12. The printed wiring board 1 and the semiconductor package 2 according to the first embodiment are not limited to the example illustrated in FIG. 1 and FIG. 2. In the first embodiment, the upper surface of the printed wiring board 1 may include another recess, and the chip parts 29 may be disposed in the other recess of the printed wiring board 1 instead of the recess 12. In addition, in the first embodiment, the chip parts 29 on the package substrate 21 are optional components.

The package substrate 21 includes the plurality of chip parts 29, a plurality of lands 31, and a plurality of lands 32. The chip parts 29 and the lands 31 are disposed on a central portion of a lower surface of the package substrate 21. The BGA balls 27 are each connected to a corresponding one of the lands 13 on the bottom surface of the recess 12 and a corresponding one of the lands 31 on the lower surface of the package substrate 21. The lands 32 are formed on an outer peripheral portion of the lower surface of the package substrate 21. The BGA balls 28 are each connected to a corresponding one of the lands 14 on the upper surface of the printed wiring board 1 and a corresponding one of the lands 32 on the lower surface of the package substrate 21. The lands 31 and 32 may be electrodes formed of copper or aluminum, for example. The lands 31 and 32 are examples of a third electrode and a fourth electrode, respectively.

The pitch P1 of the lands 13 is larger than the pitch P2 of the lands 14. The pitch P1 of the lands 13 is a distance between the centers of the two adjacent lands 13. The pitch P2 of the lands 14 is a distance between the centers of the two adjacent lands 14. The pitch P1 of the lands 13 may be 1.0 mm or 1.27 mm, and the pitch P2 of the lands 14 may be 0.8 mm.

The size S1 of the lands 13 is larger than the size S2 of the lands 14. The lands 13 may have a circular shape in plan view. In such a case, the size S1 of the lands 13 may be a diameter or a surface area of the land 13, for example. The lands 13 may have a rectangular shape in plan view. In such a case, the size S1 of the lands 13 may be indicated by a surface area of the land 13, for example. Note that the reference S1 in FIG. 2 refers to a diameter as a size of the land. The lands 14 may have a circular shape in plan view. In such a case, the size S2 of the lands 14 may be indicated by a diameter or a surface area of the land 14, for example. The lands 14 may have a rectangular shape in plan view. In such a case, the size S2 of the lands 14 is indicated by a surface area of the land 14, for example. Note that the reference S1 in FIG. 2 refers to a diameter as a size of the land. The lands 13 may have a diameter of 0.55 mm, and the lands 14 may have a diameter of 0.45 mm.

The pitch of the lands 31 is larger than the pitch of the lands 32. The pitch of the lands 31 is a distance between the centers of the adjacent tow lands 31. The pitch of the lands 32 is a distance between the centers of the adjacent tow lands 32. The pitch of the lands 31 may be 1.0 mm or 1.27 mm, and the pitch of the lands 32 may be 0.8 mm.

The size of the lands 31 is larger than the size of the lands 32. When the lands 31 have a circular shape in plan view, the size of the lands 31 may be indicated by a diameter or a surface area of the land 31, for example. When the lands 31 have a rectangular shape in plan view, the size of the lands 31 may be indicated by a surface area of the land 31, for example. When the lands 32 have a circular shape in plan view, the size of the lands 32 may be indicated by a diameter or a surface area of the land 32, for example. The lands 32 may have a rectangular shape in plan view. In such a case, the size of the lands 32 is indicated by a surface area of the land 32, for example. The lands 31 may have a diameter of 0.55 mm, and the lands 32 may have a diameter of 0.45 mm.

The pitch of the BGA balls 27 is larger than the pitch of the BGA balls 28. The pitch of the BGA balls 27 is a distance between the centers of the adjacent two BGA balls 27. The pitch of the BGA balls 28 is a distance between the centers of adjacent two BGA balls 28. The pitch of the BGA balls 27 may be 1.0 mm or 1.27 mm, and the pitch of the BGA balls 28 may be 0.8 mm.

The size of the BGA balls 27 is larger than the size of the BGA balls 28. The size of the BGA balls 27 may be indicated by a diameter, a height, or a volume of the BGA ball 27. The size of the BGA balls 28 may be indicated by a diameter, a height, or a volume of the BGA ball 28. The BGA balls 27 may have a diameter of 0.6 mm, and the BGA balls 28 may have a diameter of 0.5 mm.

Figure 27:
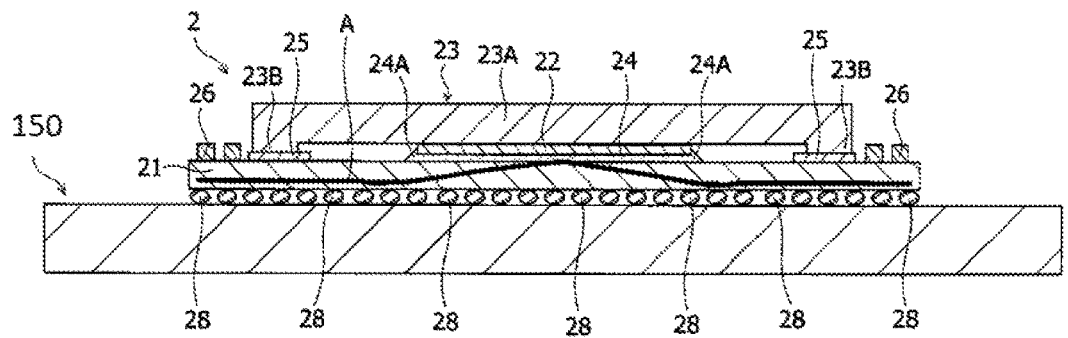
FIG. 27 is a view illustrating a printed wiring board assembly according to a comparative example.

FIG. 27 is a view illustrating a printed wiring board 150 of a printed wiring board assembly 1000 as a comparative example. A semiconductor package 2 is mounted on an upper surface of the printed wiring board 150. The upper surface of the printed wiring board 150 does not include the recess 12. A plurality of BGA balls 28 are disposed on a lower surface of a package substrate 21. The package substrate 21 is mounted on the printed wiring board 150 by a reflow process (heating process). A solid line A in FIG. 27 illustrates the contour of a warpage generated in the package substrate 21 during the reflow process. A portion of the package substrate 21 including a semiconductor chip 22 warps upward due to a difference in the thermal expansion rate between the package substrate 21 and the semiconductor chip 22. When the package substrate 21 largely warps, some of the BGA balls 28 on the lower surface of the package substrate 21 may not be in contact with the upper surface of the printed wiring board assembly 150. The reliability in connection between the printed wiring board assembly 150 and the semiconductor package 2 is lowered when some of the BGA balls 28 disposed on the lower surface of the package substrate 21 are not in contact with the upper surface of the printed wiring board assembly 150.

As illustrated in FIG. 1 and FIG. 2 illustrating the first embodiment, the printed wiring board 1 includes the recess 12 at the predetermined portion of the upper surface. The size of the lands 13 formed on the bottom surface of the recess 12 is larger than the size of the lands 14 formed on the portion of the upper surface of the printed wiring board 1 adjacent to the recess 12. The size of the lands 31 formed on the central portion of the lower surface of the package substrate 21 is larger than the size of the lands 32 formed on the outer peripheral portion of the lower surface of the package substrate 21. This configuration enables the BGA balls 27 connected to the lands 13 and 31 to have a larger size than the BGA balls 28 connected to the lands 14 and 32. The permissible warpage value of the printed wiring board 1 (substrate 11) and the permissible warpage value of the package substrate 21 are raised by allowing the BGA balls 27 to have a larger amount of solder (solder volume) than that of the BGA balls 28.

Upward warpage of the central portion of the package substrate 21 may change the distance between the printed wiring board 1 and the central portion of the package substrate 21. Warpage of the printed wiring board 1 may change the distance between the printed wiring board 1 and the central portion of the package substrate 21. Since the BGA balls 27 each have a larger amount of solder, the lands 13 and the BGA balls 27 remain connected and the lands 31 and the BGA balls 27 remain connected when the distance between the printed wiring board 1 and the central portion of the package substrate 21 changes. Furthermore, the lands 13 and the BGA balls 27 remain connected and the lands 31 and the BGA balls 27 remain connected when a stress concentrates on the BGA balls 27. This configuration improves reliability in connection between the printed wiring board 1 and the semiconductor package 2.

The pitch of the lands 13 is larger than the pitch of the lands 14. The pitch of the lands 31 is larger than the pitch of the lands 32. The pitch of the BGA balls 27 is larger than the pitch of the BGA balls 28. The size of the lands 13 is larger than the size of the lands 14. Thus, short circuit between the adjacent BGA balls 27 is unlikely to occur although the BGA balls 27 each have a larger amount of solder than that of the BGA balls 28.

The amount of solder of the BGA balls 27 may be adjusted by adjusting the size of the lands 13 or the depth of the recess 12. The amount of solder of the BGA balls 27 may be increased by increasing the size of the lands 13 or by increasing the depth of the recess 12.

A position of warpage or a degree of warpage of the package substrate 21 may be controlled by using control parameters. The examples of control parameters are the thickness of the heat spreader 23, a position of connection between the package substrate 21 and the heat spreader 23, and a load applied by the heat spreader 23 during the mounting of the heat spreader 23 and a position of the load application of the heat spreader 23. The control parameters may be used to calculate the position and the degree of warpage of the package substrate 21 to determine the position and the depth of the recess 12 of the printed wiring board 1.

The BGA balls 27 may be electrically connected to a power supply pin (power supply terminal) and a ground pin (ground terminal) of the semiconductor chips 22. The power (electricity) may be supplied from a position directly below the semiconductor chip 22 to the semiconductor chip 22. In such a case, the BGA balls 27 electrically connected to the power supply pin and the ground pin of the semiconductor chip 22 may be disposed directly below the semiconductor chip 22 or may be disposed around the position directly below the semiconductor chip 22. Thus, the recess 12 may be formed in the upper surface of the printed wiring board 1 so as to be positioned directly below the semiconductor chip 22 or to be positioned around the position directly below the semiconductor chip 22. In other words, the recess 12 may be positioned in a power supply area of the printed wiring board 1. The BGA balls 27 may be electrically connected to signal pins (signal terminals) of the semiconductor chip 22. Some of the BGA balls 27 may be electrically connected to the power supply pin and the ground pin of the semiconductor chip 22, and some of the other BGA balls 27 may be electrically connected to the signal pins of the semiconductor chip 22.

Figure 3:
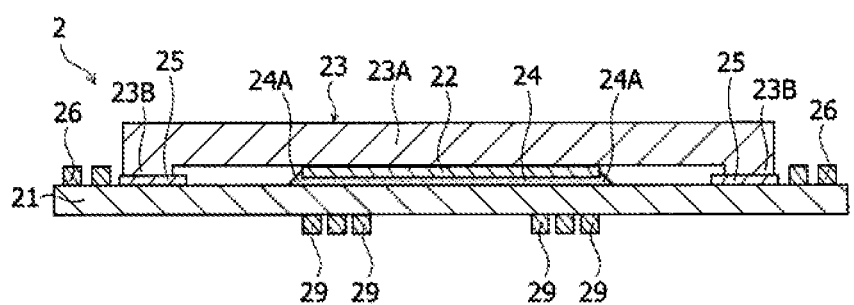
FIG. 3 illustrates a method of disposing BGA balls on a package substrate.

A method of mounting the semiconductor package 2 onto the printed wiring board 1 is described with reference to FIG. 3 to FIG. 10. The mounting method illustrated in FIG. 3 to FIG. 10 is applicable to second to eighth embodiments. A method of disposing the BGA balls 27 and 28 onto the package substrate 21 is described with reference to FIG. 3 and FIG. 4. As illustrated in FIG. 3, the semiconductor package 2 is provided. The semiconductor chip 22, the heat spreader 23, and the chip parts 26 are disposed on the upper surface of the package substrate 21. The chip parts 29 are disposed on the lower surface of the package substrate 21. Although not illustrated in FIG. 3, the plurality of lands 31 are formed on the central portion of the lower surface of the package substrate 21, and the plurality of lands 32 are formed on the outer peripheral portion of the lower surface of the package substrate 21. A copper foil or aluminum foil may be formed on the lower surface of the package 21 and etched to form the lands 31 and the lands 32 on the lower surface of the package substrate 21. The lands 31 and 32 are formed such that the lands 31 have a larger pitch than the lands 32.

Figure 4:
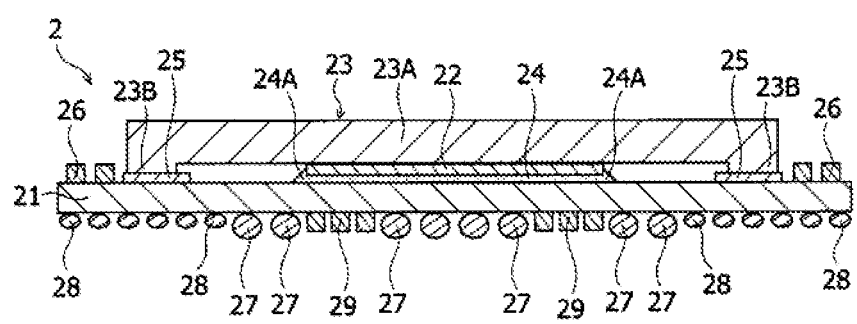
FIG. 4 illustrates a method of disposing BGA balls on the package substrate.

Then, as illustrated in FIG. 4, the plurality of BGA balls 27 and 28 are disposed on the lower surface of the package substrate 21. Prior to disposing the plurality of BGA balls 27 and 28, a flux is applied to the lands 31 and 32 on the lower surface of the package substrate 21, and then the BGA balls 27 are pressed against the lands 31 and the BGA balls 28 are pressed against the lands 32. The BGA balls 27 and 28 are adhered to the lands 31 and 32, respectively, due to the flux. Thus, the BGA balls 27 and 28 are disposed on the lower surface of the package substrate 21.

Figure 5:
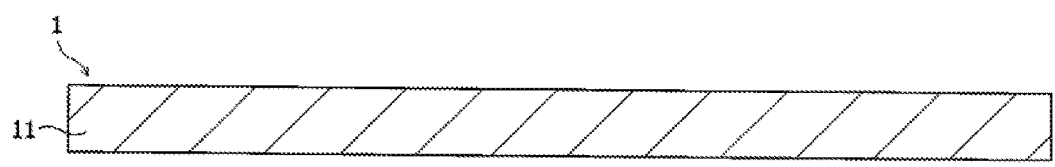
FIG. 5 illustrates a method of mounting the semiconductor package on the printed wiring board.
Figure 6:
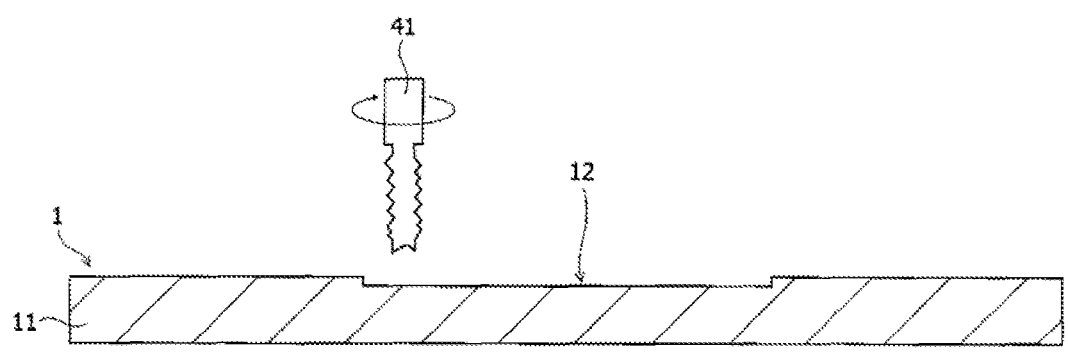
FIG. 6 illustrates a method of mounting the semiconductor package on the printed wiring board.

A method of disposing the semiconductor package 2 onto the printed wiring board 1 is described with reference to FIG. 5 to FIG. 10. As illustrated in FIG. 5, the printed wiring board 1 is provided. Then, as illustrated in FIG. 6, a rotor end mill (rotational cutting tool) 41 is moved in X and Y directions supposed on the upper surface of the printed wiring board 1 to process the predetermined portion of the upper surface of the printed wiring board 1. Thus, the recess 12 is formed at the predetermined portion of the upper surface of the printed wiring board 1.

Figure 7:
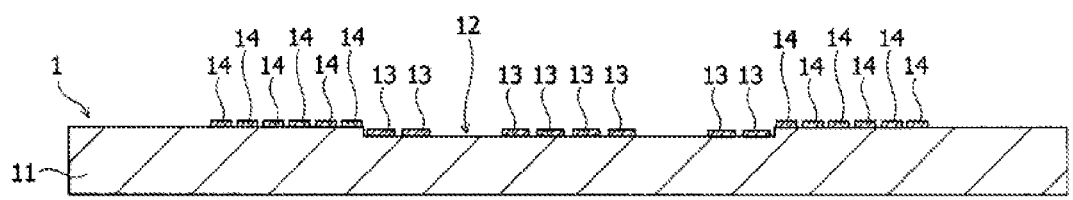
FIG. 7 illustrates a method of mounting the semiconductor package on the printed wiring board.

Then, as illustrated in FIG. 7, the plurality of lands 13 are formed on the bottom surface of the recess 12, and the plurality of lands 14 are formed on the portion of the upper surface of the printed wiring board 1 adjacent to the recess 12. A copper foil or an aluminum foil may be formed on the bottom surface of the recess 12 and etched to form the lands 13 on the bottom surface of the recess 12. A copper foil or an aluminum foil may be formed on the portion of the upper surface of the printed wiring board 1 adjacent to the recess 12 and etched to form the lands 14 on the portion of the upper surface of the printed wiring board 1 adjacent to the recess 12. The lands 13 and 14 are formed such that the lands 13 have a larger pitch than the lands 14.

Figure 8:
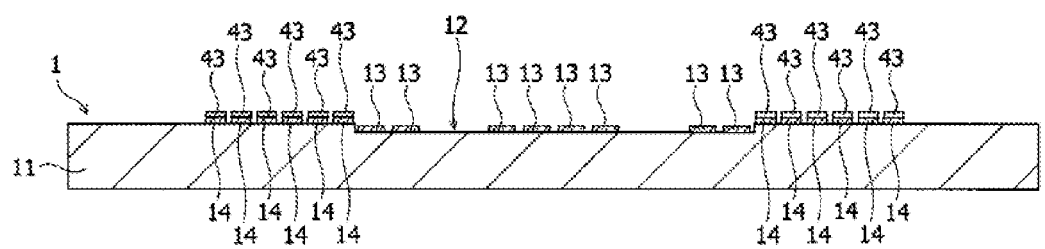
FIG. 8 illustrates a method of mounting the semiconductor package on the printed wiring board.
Figure 9:
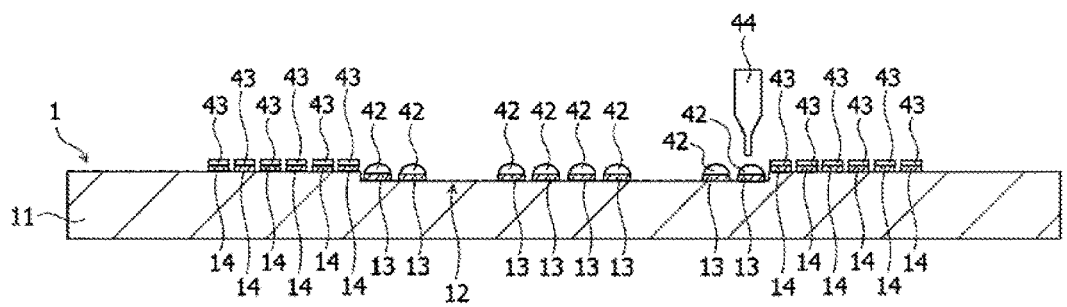
FIG. 9 illustrates a method of mounting the semiconductor package on the printed wiring board.

Then, as illustrated in FIG. 8, a plurality of solder pastes 43 are formed on the lands 14. For example, the solder pastes 43 as layers made of a solder paste may be formed on the lands 14 by using a mask printing method. Then, as illustrated in FIG. 9, a plurality of solder pastes 42 are formed on the lands 13. A dispenser 44 may be used to apply the solder paste on the lands 13 to form the solder pastes 42 on the lands 13, for example. In some embodiments, the order of the step illustrated in FIG. 8 and the step illustrated in FIG. 9 are reversed. Specifically, the solder pastes 43 may be formed on the lands 14 after the solder pastes 42 are formed on the lands 13. In addition, in some embodiments, the order of the steps illustrated in FIG. 3 and FIG. 4 and the steps illustrated in FIG. 5 to FIG. 9 are reversed. The steps illustrated in FIG. 3 and FIG. 4 may be performed after the steps illustrated in FIG. 5 to FIG. 9. Alternatively, the steps illustrated in FIG. 3 and FIG. 4 and the steps illustrated in FIG. 5 and FIG. 9 may be concurrently performed.

Figure 10:
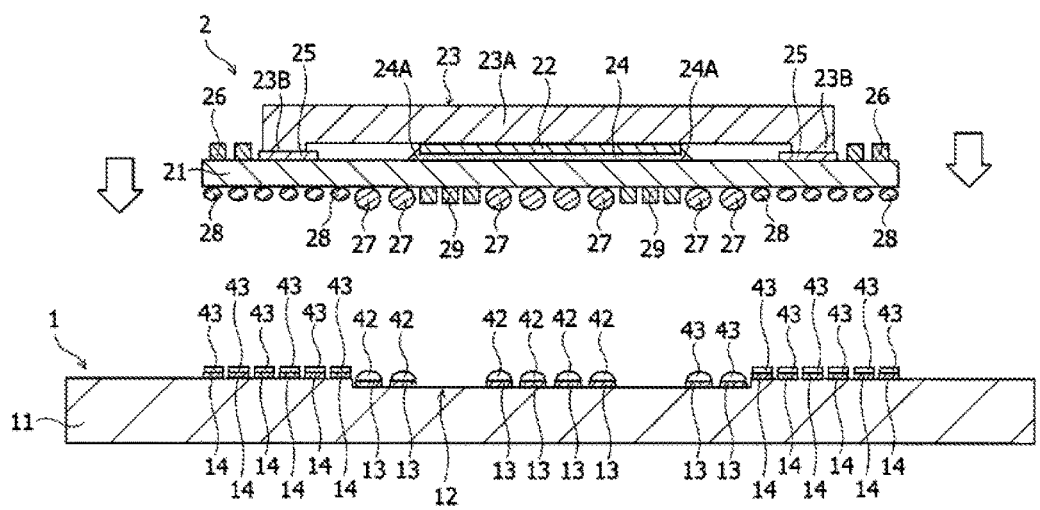
FIG. 10 illustrates a method of mounting the semiconductor package on the printed wiring board.

Then, as illustrated in FIG. 10, the positions of the printed wiring board 1 and the semiconductor package 2 are adjusted, and then the semiconductor package 2 is mounted on the printed wiring board 1. The printed wiring board 1 and the package substrate 21 are positioned such that the printed wiring board 1 faces the package substrate 21. Then, a reflow process (heating process) is performed to connect the lands 13 with the BGA balls 27, to connect the lands 14 with the BGA balls 28, to connect the BGA balls 27 with the lands 31, and to connect the BGA balls 28 with the lands 32. The flux contained in the solder paste 42 removes the oxide layer on the surface of the BGA ball 27. The solder contained in the solder paste 42 integrates with the solder in the BGA ball 27. The flux contained in the solder paste 43 removes the oxide layer on the surface of the BGA ball 28. The solder contained in the solder paste 43 integrates with the solder in the BGA ball 28.

Second Embodiment

Figure 11:
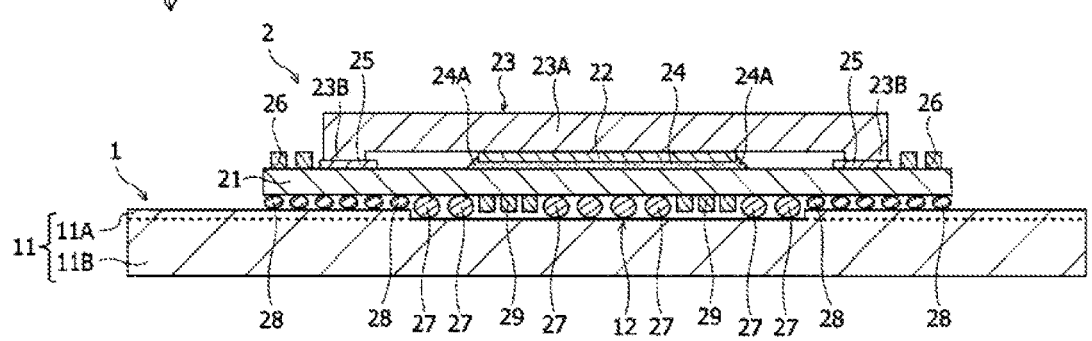
FIG. 11 is a cross-sectional view illustrating a printed wiring board assembly including a printed wiring board and a semiconductor package according to a second embodiment.
Figure 12:
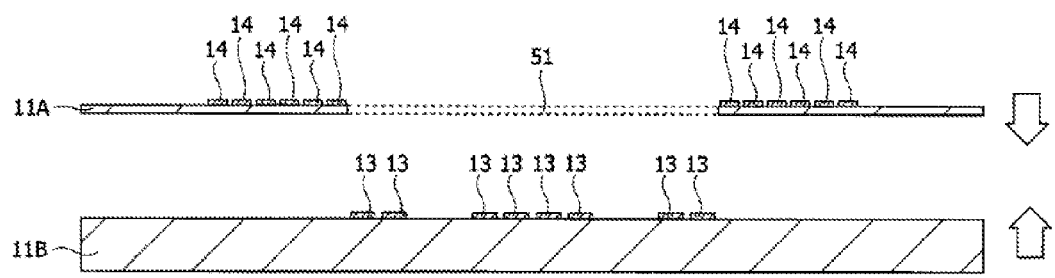
FIG. 12 illustrates the printed wiring board according to the second embodiment.

A printed wiring board assembly 200 of a second embodiment is described with reference to FIG. 11 and FIG. 12. Components of the second embodiment identical to those in the first embodiment are assigned the same reference numerals as those in the first embodiment, and the description thereof is omitted. FIG. 11 is a cross-sectional view illustrating a printed wiring board 1 and a semiconductor package 2 included in the printed wiring board assembly 200 according to the second embodiment. FIG. 12 is a view illustrating the printed wiring board 1 according to the second embodiment. The printed wiring board 1 includes a board 11 including boards 11A and 11B. As illustrated in FIG. 12, the board 11A and the board 11B are adhered together to form the board 11. An adhesive layer such as a prepreg layer may be disposed between the board 11A and the board 11B, for example. The adhesive layer allows the lower surface of the board 11A and the upper surface of the board 11B to be bonded together when brought into contact with each other. The board 11A is a board having a through hole. Specifically, the board 11A includes a through hole 51 extending through the board 11A. The through hole 51 extends through a predetermined portion of the board 11A. The predetermined portion of the board 11A may be a central portion of the board 11A.

A plurality of lands 14 are formed around the through hole 51 on the upper surface of the board 11A. A plurality of lands 13 are formed on a predetermined portion of the upper surface of the board 11B. The predetermined portion of the upper surface of the board 11B may be a central portion of the upper surface of the board 11B. The board 11A and the board 11B are bonded together to form the board 11, and as a result, the recess 12 is formed at a predetermined portion of the upper surface of the printed wiring board 1. This process may result in an omission of machine work such as cutting work processing, which is described in the first embodiment, for the upper surface of the printed wiring board 1. In addition, this enables the lands 13 to be formed on the printed wiring board 1 before the recess 12 is formed on the predetermined portion of the upper surface of the printed wiring board 1.

Third Embodiment

Figure 13:
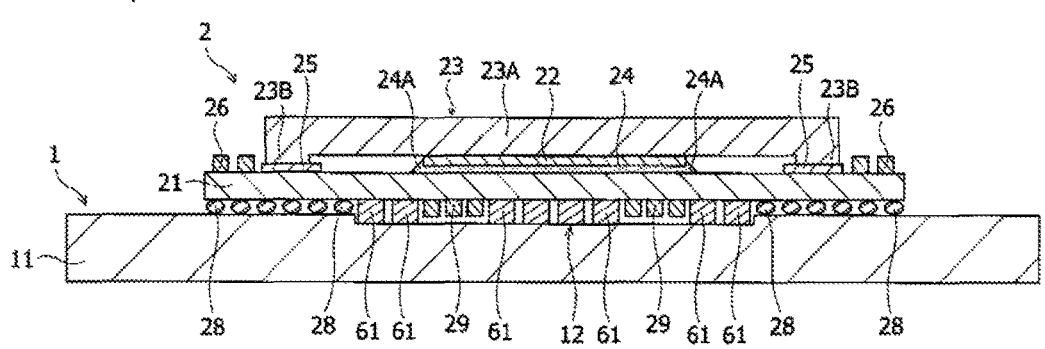
FIG. 13 is a cross-sectional view illustrating a printed wiring board assembly including a printed wiring board and a semiconductor package according to a third embodiment.

A printed wiring board assembly 300 according to a third embodiment is described with reference to FIG. 13. Components of the third embodiment identical to those in the first and second embodiments are assigned the same reference numerals as those in the first and second embodiments, and the description thereof is omitted. FIG. 13 is a cross-sectional view illustrating a printed wiring board 1 and a semiconductor package 2 included in the printed wiring board assembly 300 according to the third embodiment. As illustrated in FIG. 13, a plurality of solder members 61 are disposed on the lower surface of the package substrate 21. The solder members 61 may be columnar solder pellets. The solder member 61 is an example of a first solder. Although not illustrated in FIG. 13, the solder members 61 are connected to the lands 13 on the bottom surface of the recess 12 and are connected to the lands 31 on the lower surface of the package substrate 21. Since the solder members 61 having a shape which are able to be manipulated by a component mounting apparatus for general purpose to mount the components, are employed instead of the BGA balls 27, a ball mounting apparatus configured to dispose balls does not have to be redesigned. This may result in a reduction in the production cost of the semiconductor package 2, and as a result, may result in a reduction in the production cost of the printed wiring board 1.

The pitch of the solder members 61 is larger than the pitch of the BGA balls 28. The pitch of the solder members 61 is a distance between the centers of adjacent solder members 61. The pitch of the BGA balls 28 may be 0.8 mm, and the pitch of the solder members 61 may be 1.0 mm or 1.27 mm. The size of the solder members 61 is larger than the size of the BGA balls 28. The size of the solder members 61 may be a diameter, height, or volume of the solder member 61, for example. The BGA balls 28 may have a diameter of 0.5 mm, and the solder members 61 may have a diameter of 0.6 mm. The pitch and the size of the lands 13, 14, 31, and 32 and the pitch and the size of the BGA balls 28 in the third embodiment are similar to those in the first embodiment.

Fourth Embodiment

Figure 14:
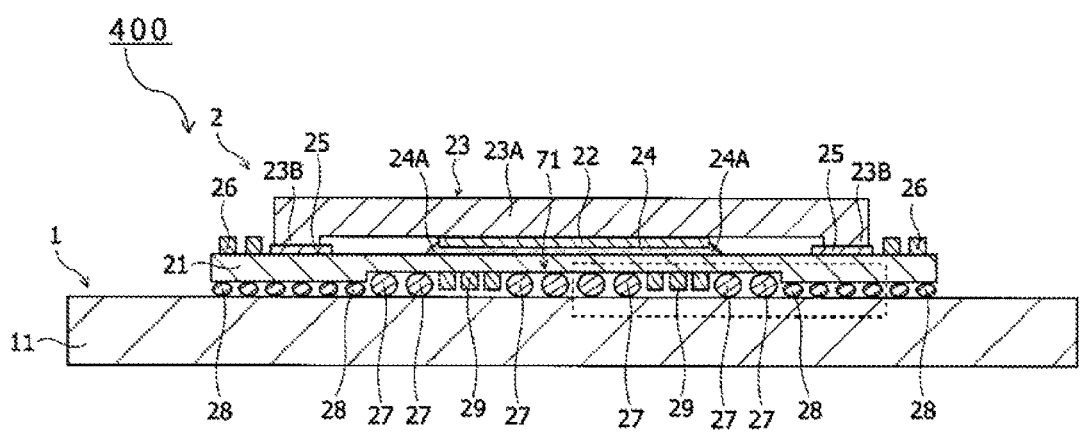
FIG. 14 is a cross-sectional view illustrating a printed wiring board assembly including a printed wiring board and a semiconductor package according to a fourth embodiment.
Figure 15:
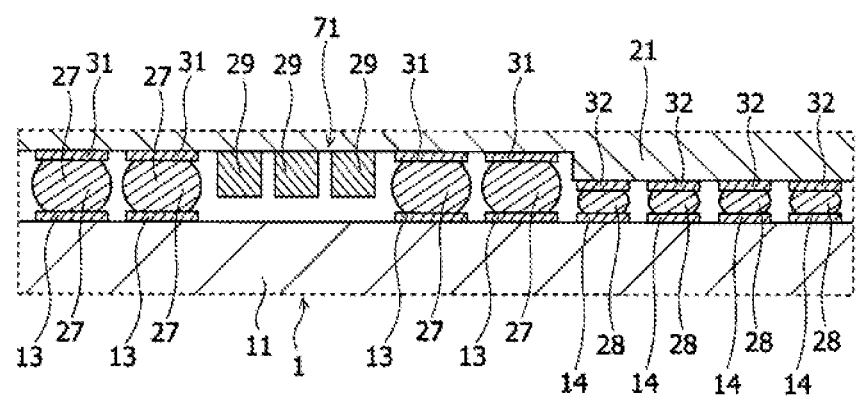
FIG. 15 is a magnified cross-sectional view illustrating the main components of the printed wiring board assembly according to the fourth embodiment.

A fourth embodiment is described with reference to FIG. 14 to FIG. 16. Components of the fourth embodiment identical to those in the first to third embodiments are assigned the same reference numerals as those in the first to third embodiments, and the description thereof is omitted. FIG. 14 is a cross-sectional view illustrating a printed wiring board 1 and a semiconductor package 2 included in a printed wiring board assembly 400 according to the fourth embodiment. FIG. 15 is a magnified cross-sectional view illustrating the main components of the printed wiring board 1 and the semiconductor package 2 according to the fourth embodiment. The printed wiring board 1 does not include the recess 12 in the upper surface, but the package substrate 21 includes a recess (counter bore) 71 at the central portion of the lower surface. Specifically, the central portion of the lower surface of the package substrate 21 is recessed from the outer peripheral portion of the lower surface of the package substrate 21. The chip parts 29 are disposed in the recess 71, and thus the chip parts 29 and the printed wiring board 1 are unlikely to be in contact with each other.

A plurality of lands 31 are formed on a bottom surface of the recess 71. A plurality of lands 32 are formed on the outer peripheral portion of the lower surface of the package substrate 21. The lands 32 are formed on the side having the recess 71 and are positioned outside the recess 71. In other words, the lands 32 are formed on a portion of the lower surface of the package substrate 21 that does not include the recess 71. With this configuration, the lands 31 and the lands 32 are positioned at different levels in the thickness direction of the package substrate 21. Before the semiconductor package 2 is mounted on the printed wiring board 1, the recess 71 is formed at the central portion of the lower surface of the package substrate 21. In addition, before the semiconductor package 2 is mounted on the printed wiring board 1, the lands 31 are formed on the bottom surface of the recess 71, and the lands 32 are formed on the portion of the lower surface of the package substrate 21 adjacent to the recess 71 (outer peripheral portion of the lower surface of the package substrate 21). The lands 31 and 32 are formed such that the lands 31 have a larger pitch than the lands 32.

In an example illustrated in FIG. 14 and FIG. 15, the chip parts 29 are disposed in the recess 71. However, the printed wiring board 1 and the semiconductor package 2 according to the fourth embodiment are not limited to the example illustrated in FIG. 14 and FIG. 15. In the fourth embodiment, the lower surface of the package substrate 21 may include another recess, and the chip parts 29 may be disposed in the other recess in the lower surface of the package substrate 21, instead of the recess 71. In the fourth embodiment, the upper surface of the printed wiring board 1 may include another recess, and the chip parts 29 may be disposed in the other recess in the upper surface of the printed wiring board 1, instead of the recess 71. In addition, in the fourth embodiment, the chip parts 29 are not disposed on the package substrate 21.

The pitch and the size of the lands 13, 14, 31, and 32 and the pitch and the size of the BGA balls 27 and 28 in the fourth embodiment are similar to those in the first embodiment. The pitch and the size of the solder members 61 in the fourth embodiment are similar to those in the third embodiment. Before the semiconductor package 2 is mounted on the printed wiring board 1, the lands 13 are disposed on the predetermined portion of the upper surface of the printed wiring board 1, and the lands 14 are disposed on the portion of the upper surface of the printed wiring board 1 adjacent to the predetermined portion. The lands 13 and the lands 14 are disposed such that the lands 13 have a larger pitch than the lands 14.

As illustrated in FIG. 14 and FIG. 15, the package substrate 21 includes the recess 71 at the central portion of the lower surface. The size of the lands 31 on the bottom surface of the recess 71 is larger than the size of the lands 32 on the outer peripheral portion of the lower surface of the package substrate 21. The size of the lands 13 on the predetermined portion of the upper surface of the printed wiring board 1 is larger than the size of the lands 14 on the portion of the upper surface of the printed wiring board 1 adjacent to the predetermined portion. This enables the BGA balls 27 connected to the lands 13 and 31 to have a larger size than the BGA balls 28 connected to the lands 14 and 32. The permissible warpage value of the printed wiring board 1 and the permissible warpage value of the package substrate 21 are raised by allowing the BGA balls 27 to have a larger amount of solder than that of the BGA balls 28.

Figure 16:
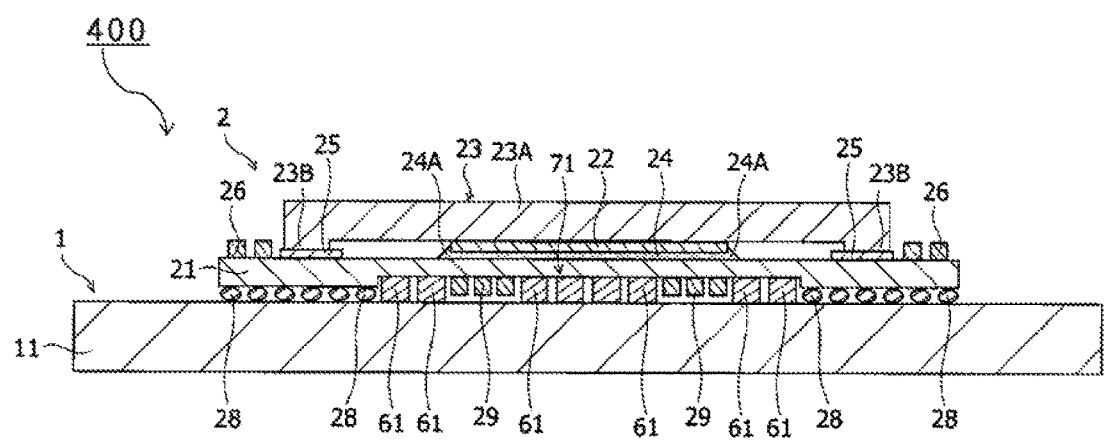
FIG. 16 is a cross-sectional view illustrating the printed wiring board assembly according to the fourth embodiment.

FIG. 16 is a cross-sectional view illustrating the printed wiring board 1 and the semiconductor package 2 included in the printed wiring board assembly 400 according to the fourth embodiment. The upper surface of the printed wiring board 1 does not include the recess 12, but the central portion of the lower surface of the package substrate 21 includes the recess 71. The plurality of solder members 61 are disposed on the lower surface of the package substrate 21. Although not illustrated in FIG. 16, the solder members 61 are connected to the lands 13 on the upper surface of the printed wiring board 1 and to the lands 31 on the bottom surface of the recess 71. Since the solder members 61 having a shape which are able to be manipulated by an apparatus for general purpose to mount the components, are employed instead of the BGA balls 27, an apparatus configured to dispose balls does not have to be redesigned. This may result in a reduction in the production cost of the semiconductor package 2, and as a result, may result in a reduction in the production cost of the printed wiring board 1.

Fifth Embodiment

Figure 17:
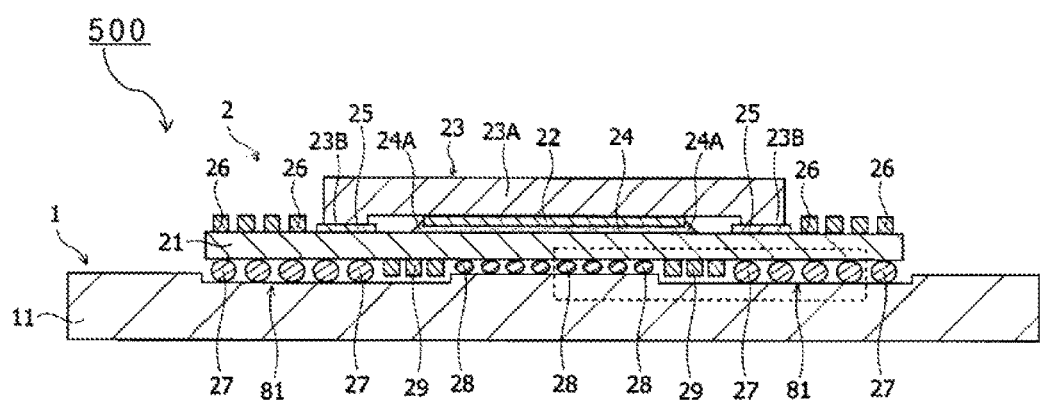
FIG. 17 is a cross-sectional view illustrating a printed wiring board assembly including a printed wiring board and a semiconductor package according to a fifth embodiment.
Figure 18:
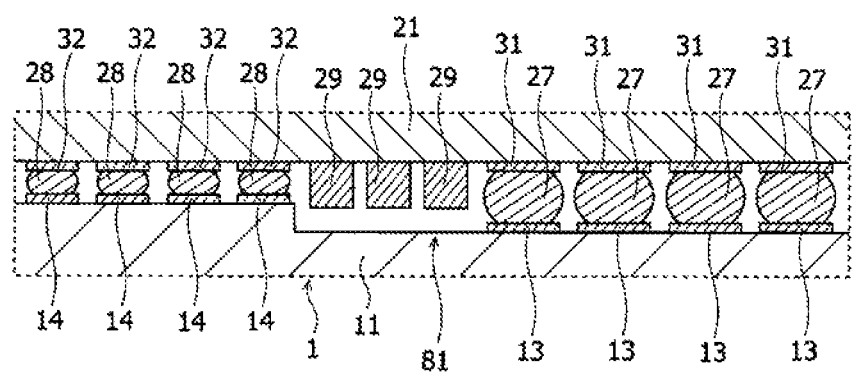
FIG. 18 is a magnified cross-sectional view illustrating the main components of the printed wiring board assembly according to the fifth embodiment.

A fifth embodiment is described with reference to FIG. 17 to FIG. 18. Components of the fifth embodiment identical to those in the first to fourth embodiments are assigned the same reference numerals as those in the first to fourth embodiments, and the description thereof is omitted. FIG. 17 is a cross-sectional view illustrating a printed wiring board 1 and a semiconductor package 2 included in a printed wiring board assembly 500 according to the fifth embodiment. FIG. 18 is a magnified cross-sectional view illustrating the main components of the printed wiring board 1 and the semiconductor package 2 according to the fifth embodiment. In the fifth embodiment, the heat spreader 23 has a small size and a light weight compared to the heat spreader 23 in the first to fourth embodiments. The reduction in weight of the heat spreader 23 enables the semiconductor package 2 to have a lighter weight. The reduction in size of the heat spreader 23 allows the side wall 23B of the heat spreader 23 to be positioned slightly closer to the center of the package substrate 21 than that in FIG. 1. This increases a blank space on the package substrate 21, enabling more chip parts 26 to be mounted on the package substrate 21. The increase in the number of the chip parts 26 on the package substrate 21 may reduce the noise of the semiconductor chip 22.

An underfill resin 24 is disposed between the package substrate 21 and the semiconductor chip 22, and a fillet 24A is formed at an outer peripheral portion of the under fill resin 24. A portion of the package substrate 21 positioned directly below the fillet 24A readily warps downward due to the influence of the fillet 24A of the under fill resin 24. In the fifth embodiment, the side wall 23B of the heat spreader 23 is positioned closer to the center of the package substrate 21 so as to reduce the warpage of the portion of the package substrate 21 positioned directly below the fillet 24A.

Since the side wall 23B of the heat spreader 23 is positioned close to the central portion of the package substrate 21, the outer peripheral portion of the package substrate 21 readily warps upward. As illustrated in FIG. 17, the printed wiring board 1 includes a recess (counter bore) 81 at a portion of the upper surface facing the outer peripheral portion of the package substrate 21. The portion of the upper surface of the printed wiring board 1 adjacent to a predetermined portion is recessed from the predetermined portion of the upper surface of the printed wiring board 1. The predetermined portion of the upper surface of the printed wiring board 1 may be a central portion of the upper surface of the printed wiring board 1. The predetermined portion of the upper surface of the printed wiring board 1 may be a portion of the upper surface of the printed wiring board 1 facing the central portion of the package substrate 21. The chip parts 29 are positioned in the recess 81, and thus the chip parts 29 and the printed wiring board 1 are unlikely to be in contact with each other.

A plurality of lands 13 are formed on a bottom surface of the recess 81. A plurality of lands 14 are formed on a predetermined portion of the upper surface of the printed wiring board 1. The lands 14 are formed on the surface having the recess 81 and are positioned outside the recess 81. In other words, the lands 14 are formed on a portion of the upper surface of the printed wiring board 1 that does not include the recess 81. With this configuration, the lands 13 and the lands 14 are positioned at different levels in the thickness direction of the printed wiring board 1. Before the semiconductor package 2 is mounted on the printed wiring board 1, the recess 81 is formed on the portion of the upper surface of the printed wiring board 1 adjacent to the predetermined portion. In addition, before the semiconductor package 2 is mounted on the printed wiring board 1, the lands 13 are formed on the bottom surface of the recess 81, and the lands 14 are formed on the portion of the upper surface of the printed wiring board 1 adjacent to the recess 81 (predetermined portion of the upper surface of the printed wiring board 1). The lands 13 and the lands 14 are formed such that the lands 13 have a larger pitch than the lands 14.

In an example illustrated in FIG. 17 and FIG. 18, the chip parts 29 are positioned in the recess 81. The printed wiring board 1 and the semiconductor package 2 according to the fifth embodiment are not limited to the example illustrated in FIG. 17 and FIG. 18. In the fifth embodiment, the upper surface of the printed wiring board 1 may include another recess, and the chip parts 29 may be positioned in the other recess of the printed wiring board 1 instead of the recess 81. In addition, in the fifth embodiment, the chip parts 29 may not be included on the package substrate 21.

The plurality of chip parts 29 and a plurality of lands 31 are disposed or formed on the outer peripheral portion of the lower surface of the package substrate 21. The BGA balls 27 are connected to the lands 13 on the bottom surface of the recess 81 and to the lands 31 on the lower surface of the package substrate 21. A plurality of lands 32 are formed on the central portion of the lower surface of the package substrate 21. The BGA balls 28 are connected to the lands 14 formed on the upper surface of the printed wiring board 1 and to the lands 32 formed on the lower surface of the package substrate 21.

The pitch and the size of the lands 13, 14, 31, and 32 and the pitch and the size of the BGA balls 27 and 28 in the fifth embodiment are similar to those in the first embodiment. Before the semiconductor package 2 is mounted on the printed wiring board 1, the lands 31 are formed on the outer peripheral portion of the lower surface of the package substrate 21, and the lands 32 are formed on the central portion of the lower surface of the package substrate 21. The lands 31 and the lands 32 are disposed such that the lands 31 have a larger pitch than the lands 32.

As illustrated in FIG. 17 and FIG. 18, the printed wiring board 1 includes the recess 81 at the position of the upper surface adjacent to the predetermined portion. The size of the lands 13 formed on the bottom surface of the recess 81 is larger than the size of the lands 14 formed on the predetermined portion of the upper surface of the printed wiring board 1. The size of the lands 31 formed on the outer peripheral portion of the lower surface of the package substrate 21 is larger than the size of the lands 32 formed on the central portion of the lower surface of the package substrate 21. This configuration enables the BGA balls 27 connected to the lands 13 and 31 to have a larger size than the size of the BGA balls 28 connected to the lands 14 and 32. The permissible warpage value of the printed wiring board 1 and the permissible warpage value of the package substrate 21 are raised by allowing the BGA balls 27 to have a larger amount of solder than that of the BGA balls 28.

Upward warpage of the outer peripheral portion of the package substrate 21 may change a distance between the printed wiring board 1 and the outer peripheral portion of the package substrate 21. Warpage of the printed wiring board 1 may change a distance between the printed wiring board 1 and the outer peripheral portion of the package substrate 21. Since the BGA balls 27 have a larger amount of solder, the lands 13 and the BGA balls 27 remain connected and the lands 31 and the BGA balls 27 remain connected when the distance between the printed wiring board 1 and the outer peripheral portion of the package substrate 21 changes. Furthermore, since the BGA balls 27 have a larger amount of solder, the lands 13 and the BGA balls 27 remain connected and the lands 31 and the BGA balls 27 remain connected when the stress concentrates on the BGA balls 27. This configuration may improve the reliability in connection between the printed wiring board 1 and the semiconductor package 2.

Sixth Embodiment

Figure 19:
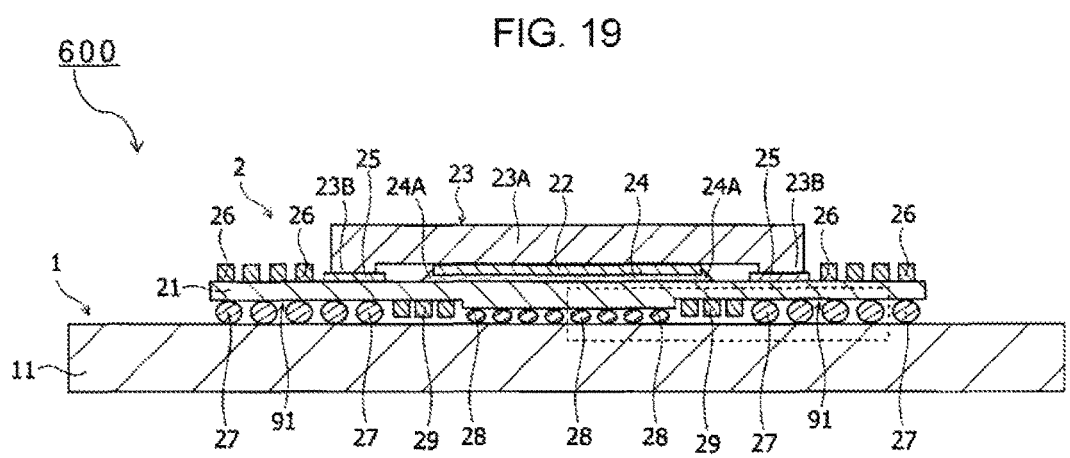
FIG. 19 is a cross-sectional view illustrating a printed wiring board assembly including a printed wiring board and a semiconductor package according to a sixth embodiment.
Figure 20:
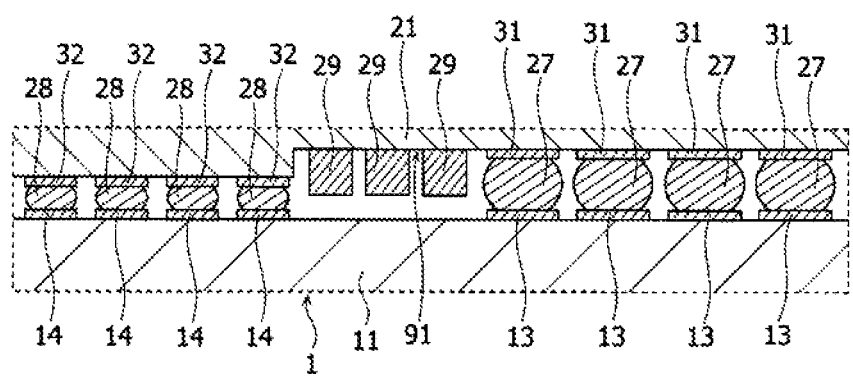
FIG. 20 is a magnified cross-sectional view illustrating the main components of the printed wiring board assembly according to the sixth embodiment.

A sixth embodiment is described with reference to FIG. 19 to FIG. 20. Components of the sixth embodiment identical to those in the first to fifth embodiments are assigned the same reference numerals as those in the first to fifth embodiments, and the description thereof is omitted. FIG. 19 is a cross-sectional view illustrating a printed wiring board 1 and a semiconductor package 2 included in a printed wiring board assembly 600 according to the sixth embodiment. FIG. 20 is a magnified cross-sectional view illustrating the main components of the printed wiring board 1 and the semiconductor package 2 according to the sixth embodiment. In the sixth embodiment, the heat spreader 23 has a small size and a light weight compared to the heat spreader 23 in the first to fourth embodiments. The reduction in weight of the heat spreader 23 enables the semiconductor package 2 to have a lighter weight. The reduction in size of the heat spreader 23 allows the side wall 23B of the heat spreader 23 to be positioned close to the central portion of the package substrate 21. This increases a blank space on the package substrate 21, enabling more chip parts 26 to be mounted on the package substrate 21. The increase in the number of the chip parts 26 on the package substrate 21 may reduce the noise of the semiconductor chip 22.

Since the side wall 23B of the heat spreader 23 is positioned close to the central portion of the package substrate 21, the outer peripheral portion of the package substrate 21 readily warps upward. As illustrated in FIG. 19, in the sixth embodiment, the package substrate 21 includes a recess (counter bore) 91 at the outer peripheral portion of the lower surface. Specifically, the outer peripheral portion of the lower surface of the package substrate 21 is recessed from the central portion of the lower surface of the package substrate 21. The chip parts 29 are disposed in the recess 91, and thus the chip parts 29 and the printed wiring board 1 are unlikely to be in contact with each other.

A plurality of lands 31 are formed on a bottom surface of the recess 91. A plurality of lands 32 are formed on the central portion of the lower surface of the package substrate 21. The lands 32 are formed on the same side as the recess 91 and are positioned outside the recess 91. In other words, the lands 32 are formed on a portion of the lower surface of the package substrate 21 that does not include the recess 91. With this configuration, the lands 31 and the lands 32 are positioned at different levels in the thickness direction of the package substrate 21. Before the semiconductor package 2 is mounted on the printed wiring board 1, the recess 91 is formed in the outer peripheral portion of the lower surface of the package substrate 21. In addition, before the semiconductor package 2 is mounted on the printed wiring board 1, the lands 31 are formed on the bottom surface of the recess 91, and the lands 32 are formed on the portion of the lower surface of the package substrate 21 adjacent to the recess 91 (central portion of the lower surface of the package substrate 21). The lands 31 and 32 are formed such that the lands 31 have a larger pitch than the lands 32.

In an example illustrated in FIG. 19 and FIG. 20, the chip parts 29 are disposed in the recess 91. However, the printed wiring board 1 and the semiconductor package 2 according to the sixth embodiment are not limited to the example illustrated in FIG. 19 and FIG. 20. In the sixth embodiment, the lower surface of the package substrate 21 may include another recess, and the chip parts 29 may be disposed in the other recess of the package substrate 21, instead of the recess 91. In addition, in the sixth embodiment, the package substrate 21 may not include the chip parts 29.

The pitch and the size of the lands 13, 14, 31, and 32 and the pitch and the size of the BGA balls 27 and 28 in the sixth embodiment are similar to those in the first embodiment. Before the semiconductor package 2 is mounted on the printed wiring board 1, the lands 13 are formed on the portion of the upper surface of the printed wiring board 1 adjacent to the predetermined portion, and the lands 14 are formed on the predetermined portion of the upper surface of the printed wiring board 1. The lands 13 and the lands 14 are formed such that the lands 13 have a larger pitch than the lands 14.

As illustrated in FIG. 19 and FIG. 20, the package substrate 21 includes the recess 91 at the outer peripheral portion of the lower surface of the package substrate 21. The size of the lands 31 formed on the bottom surface of the recess 91 is larger than the size of the lands 32 formed on the central portion of the lower surface of the package substrate 21. The size of the lands 13 formed on the portion adjacent to the predetermined portion of the upper surface of the printed wiring board 1 is larger than the size of the land 14 formed on the predetermined portion of the upper surface of the printed wiring board 1. This configuration enables the BGA balls 27 connected to the lands 13 and 31 to have a larger size than the size of the BGA balls 28 connected to the lands 14 and 32. The permissible warpage value of the printed wiring board 1 and the permissible warpage value of the package substrate 21 are raised by allowing the BGA balls 27 to have a larger amount of solder than that of the BGA balls 28.

In the sixth embodiment, solder members 61 may be disposed on the lower surface of the package substrate 21, instead of the BGA balls 27. In such a case, since the solder members 61, which are able to be disposed by an apparatus configured to dispose the other components, are employed instead of the BGA balls 27, an apparatus configured to dispose balls does not have to be redesigned. This may result in a reduction in the production cost of the semiconductor package 2, and as a result, may result in a reduction in the production cost of the printed wiring board 1.

Seventh Embodiment

Figure 21:
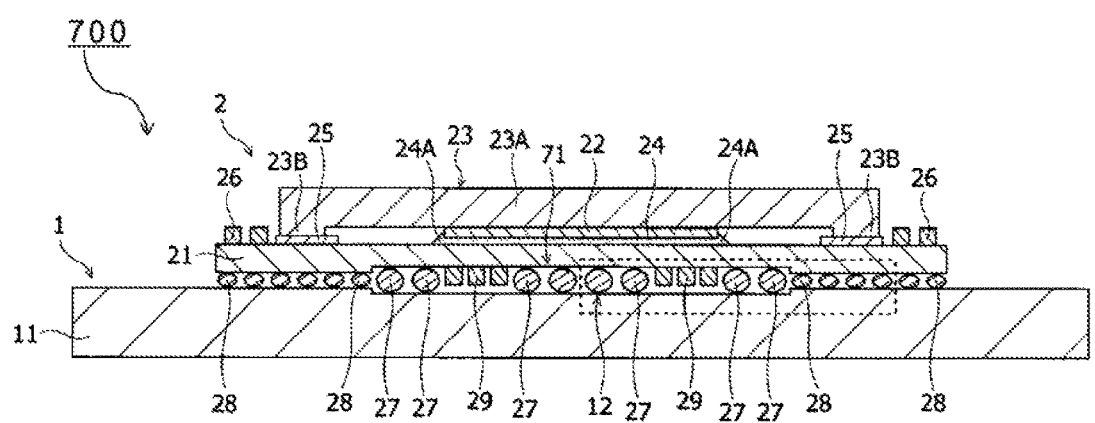
FIG. 21 is a cross-sectional view illustrating a printed wiring board assembly including a printed wiring board and a semiconductor package according to a seventh embodiment.
Figure 22:
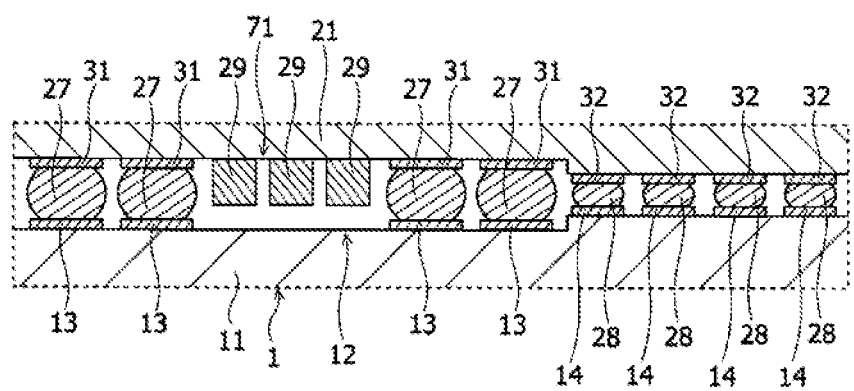
FIG. 22 is a magnified cross-sectional view illustrating the main components of the printed wiring board assembly according to the seventh embodiment.

A seventh embodiment is described with reference to FIG. 21 to FIG. 22. Components of the seventh embodiment identical to those in the first to sixth embodiments are assigned the same reference numerals as those in the first to sixth embodiments, and the description thereof is omitted. FIG. 21 is a cross-sectional view illustrating a printed wiring board 1 and a semiconductor package 2 included in a printed wiring board assembly 700 according to the seventh embodiment. FIG. 22 is a magnified cross-sectional view illustrating the main components of the printed wiring board 1 and the semiconductor package 2 according to the seventh embodiment. As illustrated in FIG. 21 and FIG. 22, the printed wiring board 1 includes a recess 12 at the predetermined portion of the upper surface the printed wiring board 1, and the package substrate 21 includes a recess 71 at the central portion of the lower surface of the package substrate 21. The chip parts 29 may be positioned in the recess 71 or may be positioned in the recesses 12 and 71. With this configuration, the chip parts 29 and the printed wiring board 1 are unlikely to be in contact with each other.

The pitch and the size of the lands 13, 14, 31, and 32 and the pitch and the size of the BGA balls 27 and 28 in the seventh embodiment are similar to those in the first embodiment. Before the semiconductor package 2 is mounted on the printed wiring board 1, the recess 12 is formed at the predetermined portion of the upper surface of the printed wiring board 1. In addition, before the semiconductor package 2 is mounted on the printed wiring board 1, the lands 13 are formed on the bottom surface of the recess 12, and the lands 14 are formed on a portion of the upper surface of the printed wiring board 1 adjacent to the recess 12. The lands 13 and the lands 14 are formed such that the lands 13 have a larger pitch than the lands 14. Before the semiconductor package 2 is mounted on the printed wiring board 1, the recess 71 is formed at the central portion of the lower surface of the package substrate 21. Before the semiconductor package 2 is mounted on the printed wiring board 1, the lands 31 are formed on the bottom surface of the recess 71, and the lands 32 are formed on a portion of the lower surface of the package substrate 21 adjacent to the recess 71 (outer peripheral portion of the lower surface of the package substrate 21). The lands 31 and 32 are formed such that the lands 31 have a larger pitch than the lands 32.

The size of the lands 13 formed on the bottom surface of the recess 12 is larger than the size of the lands 14 formed on the portion of the upper surface of the printed wiring board 1 adjacent to the recess 12. The size of the lands 31 formed on the bottom surface of the recess 71 is larger than the size of the lands 32 formed on the outer peripheral portion of the lower surface of the package substrate 21. This configuration enables the BGA balls 27 connected to the lands 13 and 31 to have a larger size than that of the BGA balls 28 connected to the lands 14 and 32. The permissible warpage value of the printed wiring board 1 and the permissible warpage value of the package substrate 21 are raised by allowing the BGA balls 27 to have a larger amount of solder than that of the BGA balls 28.

In the seventh embodiment, the solder members 61 may be disposed on the lower surface of the package substrate 21, instead of the BGA balls 27. In such a case, since the solder members 61, which are able to be disposed by an apparatus configured to dispose components, are employed instead of the BGA balls 27, an apparatus configured to dispose balls does not have to be redesigned. This may result in a reduction in the production cost of the semiconductor package 2, and as a result, may result in a reduction in the production cost of the printed wiring board 1.

Eighth Embodiment

Figure 23:
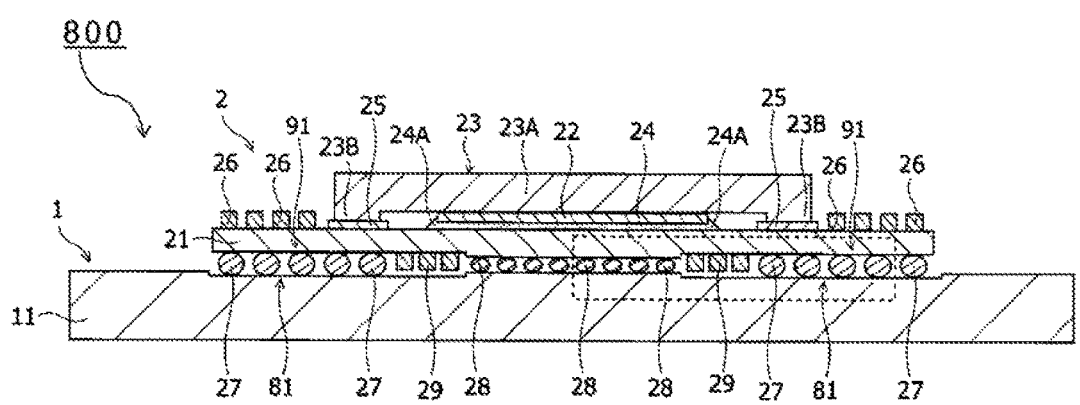
FIG. 23 is a cross-sectional view illustrating a printed wiring board assembly including a printed wiring board and a semiconductor package according to an eighth embodiment.
Figure 24:
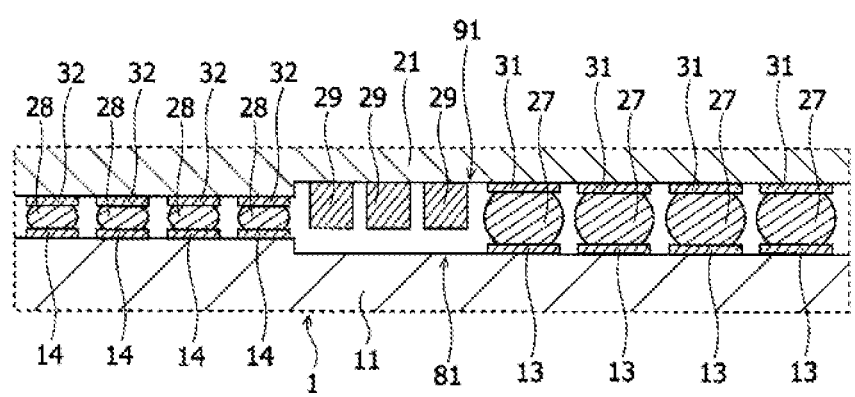
FIG. 24 is a magnified cross-sectional view illustrating the main components of the printed wiring board assembly including a printed wiring board according to the eight embodiment.

An eighth embodiment is described with reference to FIG. 23 to FIG. 24. Components of the eighth embodiment identical to those in the first to seventh embodiments are assigned the same reference numerals as those in the first to seventh embodiments, and the description thereof is omitted. FIG. 23 is a cross-sectional view illustrating a printed wiring board 1 and a semiconductor package 2 included in a printed wiring board assembly 800 according to the eighth embodiment. FIG. 24 is a magnified cross-sectional view illustrating the main components of the printed wiring board 1 and the semiconductor package 2 according to the eighth embodiment. As illustrated in FIG. 23 and FIG. 24, the upper surface of the printed wiring board 1 includes a recess 81 at a portion of the upper surface of the printed wiring board 1 adjacent to the predetermined portion of the printed wiring board 1, and the package substrate 21 includes a recess 91 at the outer peripheral portion of the lower surface the package substrate 21. The chip parts 29 may be positioned in the recess 91 or may be positioned in the recesses 81 and 91. With this configuration, the chip parts 29 and the printed wiring board 1 are unlikely to be in contact with each other.

The pitch and the size of the lands 13, 14, 31, and 32 and the pitch and the size of the BGA balls 27 and 28 in the eighth embodiment are similar to those in the first embodiment. Before the semiconductor package 2 is mounted on the printed wiring board 1, the recess 81 is formed in the portion of the upper surface of the printed wiring board 1 adjacent to the predetermined portion. In addition, before the semiconductor package 2 is mounted on the printed wiring board 1, the lands 13 are formed on the bottom surface of the recess 81, and the lands 14 are formed on the portion of the upper surface of the printed wiring board 1 adjacent to the recess 81 (predetermined portion of the upper surface of the printed wiring board 1). The lands 13 and the lands 14 are formed such that the lands 13 have a larger pitch than that of the lands 14. Before the semiconductor package 2 is mounted on the printed wiring board 1, the recess 91 is formed in the outer peripheral portion of the lower surface of the package substrate 21. In addition, before the semiconductor package 2 is mounted on the printed wiring board 1, the lands 31 are formed on the bottom surface of the recess 91, and the lands 32 are formed on the portion of the lower surface of the package substrate 21 adjacent to the recess 91 (central portion of the lower surface of the package substrate 21). The lands 31 and 32 are formed such that the lands 31 have a larger pitch than that of the lands 32.

The size of the lands 13 formed on the bottom surface of the recess 81 is larger than the size of the lands 14 formed on the portion of the upper surface of the printed wiring board 1 adjacent to the recess 81. The size of the lands 31 on the bottom surface of the recess 91 is larger than the size of the lands 32 formed on the outer peripheral portion of the lower surface of the package substrate 21. This configuration enables the BGA balls 27 connected to the lands 13 and 31 to have a larger size than that the BGA balls 28 connected to the lands 14 and 32. The permissible warpage value of the printed wiring board 1 and the permissible warpage value of the package substrate 21 are raised by allowing the BGA balls 27 to have a larger amount of solder than that of the BGA balls 28.

Figure 25:
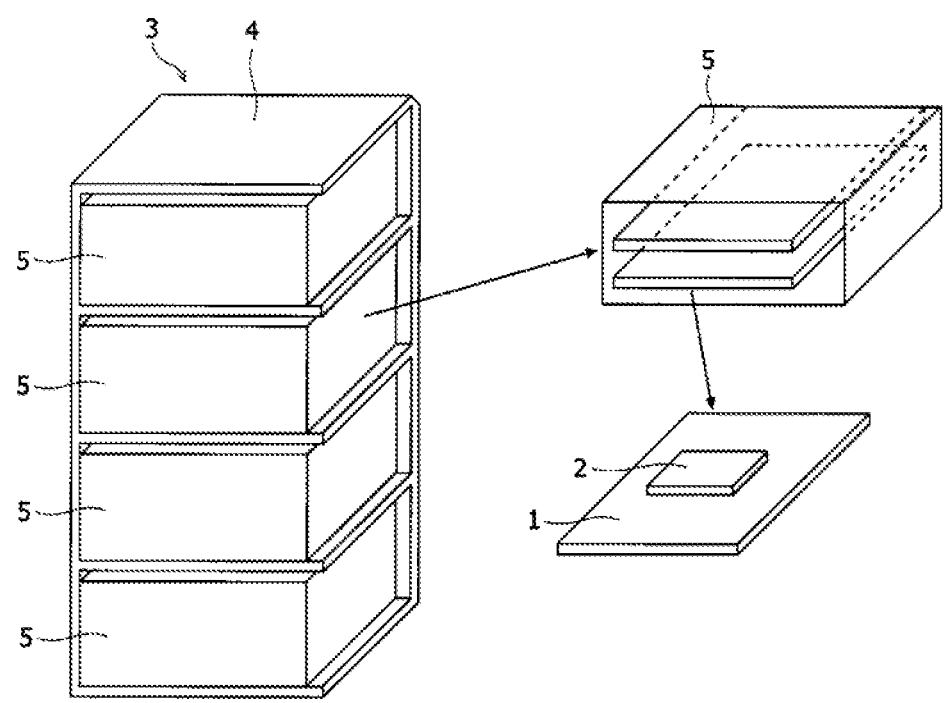
FIG. 25 is a view illustrating an electrical device including a printed wiring board assembly including a printed wiring board on which a semiconductor package is mounted.

FIG. 25 illustrates an electrical device 3 including the printed wiring board 1 on which the semiconductor package 2 is mounted. The printed wiring board 1 and the semiconductor package 2 according to any one of the first to eight embodiments are used as the printed wiring board 1 and the semiconductor package 2 illustrated in FIG. 25. The electrical device 3 includes a rack (housing) 4 and a plurality of units 5 housed in the rack 4. Each unit 5 includes a plurality of printed wiring board 1 each having the semiconductor package 2 thereon. The electrical device 3 illustrated in FIG. 25 includes a plurality of printed wiring boards 1 and a plurality of semiconductor packages 2, but the electrical device 3 may include one printed wiring board 1 and one semiconductor package 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed wiring board assembly comprising:
   a first board that includes a first surface;
   a second board that includes a second surface and faces the first surface;
   a plurality of first electrodes formed on a bottom surface of a recess, the recess being formed in one of the first surface and the second surface;
   a plurality of second electrodes formed on the one of the first surface and the second surface, the plurality of second electrodes being positioned outside the recess;
   a plurality of first solders each coupled to a respective one of the plurality of first electrodes; and
   a plurality of second solders each coupled to a respective one of the plurality of second electrodes,
   wherein the plurality of first electrodes are formed at a larger pitch than a pitch at which the plurality of second electrodes are formed, and a size of each the plurality of first solders is larger than a size of the plurality of second solders.

2. The printed wiring board assembly according to claim 1, wherein when the recess is formed in the first surface, the recess is positioned to face a central portion of the second board.

3. The printed wiring board assembly according to claim 1, wherein when the recess is formed in the second surface positioned, the recess is positioned in a central portion of the second board.

4. The printed wiring board assembly according to claim 1, further comprising:
   a semiconductor chip mounted on a third surface of the second board opposite the second surface; and
   a heat spreader positioned over the semiconductor chip and fixed to the third surface,
   wherein when the recess is formed in the first surface, the recess is positioned to face an outer periphery of the second board.

5. The printed wiring board assembly according to claim 1, further comprising:
   a semiconductor chip mounted on a third surface of the second board opposite the second surface; and
   a heat spreader positioned over the semiconductor chip and fixed to the third surface,
   wherein when the recess is formed in the second surface, the recess is formed in an outer periphery of the second surface of the second board.

6. An electrical device comprising:
   a printed wiring board assembly includes,
   a first board that includes a first surface,
   a second board that includes a second surface and faces the first surface,
   a plurality of first electrodes formed on a bottom surface of a recess, the recess being formed in one of the first surface and the second surface,
   a plurality of second electrodes formed on the one of the first surface and the second surface, the plurality of second electrodes being positioned outside the recess,
   a plurality of first solders each coupled to a respective one of the plurality of first electrodes, and
   a plurality of second solders each coupled to a respective one of the plurality of second electrodes,
   wherein the plurality of first electrodes are formed at a larger pitch than a pitch at which the plurality of second electrodes are formed, and a size of each the plurality of first solders is larger than a size of the second solders.

7. A method for assembling a printed wiring board assembly, the method comprising:
   providing a first board that includes a first surface;
   providing a second board that includes a second surface;
   performing a first forming or a second forming,
      the first forming including,
         forming a recess in the first surface,
         forming a plurality of first electrodes on a bottom surface of the recess,
         forming a plurality of second electrodes on the first surface, the plurality of second electrodes configured to be positioned outside the recess, the plurality of first electrodes configured to be formed at a larger pitch than a pitch at which the plurality of second electrodes are formed, and
         forming a plurality of third electrodes and a plurality of fourth electrodes on the second surface, the plurality of third electrodes configured to be formed at a larger pitch than a pitch at which the plurality of fourth electrodes, and
      the second forming includes,
         forming a recess in the second surface,
         forming a plurality of third electrodes on a bottom surface of the recess,
         forming a plurality of fourth electrodes on the second surface, the plurality of fourth electrodes configured to be positioned outside the recess, the plurality of third electrodes configured to be formed at a larger pitch than a pitch at which the plurality of fourth electrodes are formed; and
   forming a plurality of first solders each formed on a respective one of the plurality of third electrodes;
   forming a plurality of second solders each formed on a respective one of the plurality of fourth electrodes;
   positioning the first board and the second board such that the first surface of the first board faces the second surface of the second board; and
   performing a heating process to couple each of the plurality of first electrodes with a corresponding one of the plurality of first solders, each of the plurality of second electrodes with a corresponding one of the second plurality of solders, each of the plurality of first solders with a corresponding one of the plurality of third electrodes, and each of the plurality of second solders with a corresponding one of the plurality of fourth electrodes,
   wherein a size of each the plurality of first solders is larger than a size of the plurality of second solders.

* * * * *